(12) United States Patent
Lee et al.

(10) Patent No.: US 12,484,364 B2
(45) Date of Patent: Nov. 25, 2025

(54) DISPLAY DEVICE AND METHOD OF MANUFACTURING THE SAME

(71) Applicant: Samsung Display Co., LTD., Yongin-si (KR)

(72) Inventors: Sung Jin Lee, Yongin-si (KR); Jong Chan Lee, Yongin-si (KR); Hyun Wook Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 878 days.

(21) Appl. No.: 17/691,451

(22) Filed: Mar. 10, 2022

(65) Prior Publication Data

US 2022/0392948 A1    Dec. 8, 2022

(30) Foreign Application Priority Data

Jun. 8, 2021   (KR) .................. 10-2021-0074337

(51) Int. Cl.
| | | |
|---|---|---|
| *H10H 29/80* | (2025.01) | |
| *H10H 29/01* | (2025.01) | |
| *H10H 29/39* | (2025.01) | |
| *H10H 29/49* | (2025.01) | |
| *H10H 20/831* | (2025.01) | |

(52) U.S. Cl.
CPC ........ *H10H 29/842* (2025.01); *H10H 29/012* (2025.01); *H10H 29/034* (2025.01); *H10H 29/0364* (2025.01); *H10H 29/39* (2025.01); *H10H 29/49* (2025.01); *H10H 20/831* (2025.01)

(58) Field of Classification Search
CPC ................ H01L 25/0753; H10H 29/24; H10H 29/30–49; H10H 29/857; H10H 20/857
See application file for complete search history.

(56) References Cited

U.S. PATENT DOCUMENTS

| | | |
|---|---|---|
| 10,497,680 B2 | 12/2019 | Sung et al. |
| 2021/0151419 A1 | 5/2021 | Lee et al. |
| 2021/0151499 A1 | 5/2021 | Park et al. |
| 2021/0288217 A1* | 9/2021 | Li ............................ H10H 20/84 |
| 2021/0376210 A1* | 12/2021 | Lee ....................... H10H 20/853 |
| 2022/0005978 A1 | 1/2022 | Im et al. |
| 2022/0045241 A1* | 2/2022 | Kim ..................... H10H 29/142 |
| 2022/0059739 A1 | 2/2022 | Li et al. |
| 2022/0077350 A1* | 3/2022 | Lee ....................... H10H 20/854 |
| 2022/0102604 A1 | 3/2022 | Do et al. |

FOREIGN PATENT DOCUMENTS

| | | |
|---|---|---|
| KR | 10-1874993 | 6/2018 |
| KR | 10-2020-0010704 | 1/2020 |
| KR | 10-2020-0060602 | 6/2020 |

(Continued)

*Primary Examiner* — Lauren R Bell
(74) *Attorney, Agent, or Firm* — Womble Bond Dickinson (US) LLP

(57) ABSTRACT

A display device includes a first alignment electrode and a second alignment electrode spaced apart from each other and disposed on a substrate, light emitting elements disposed between the first alignment electrode and the second alignment electrode, and an amorphous silicon layer disposed on the light emitting elements. The amorphous silicon layer includes an electrode portion disposed on a first end portion and a second end portion of each of the light emitting elements, and an insulating portion.

15 Claims, 15 Drawing Sheets

(56) References Cited

FOREIGN PATENT DOCUMENTS

| | | |
|---|---|---|
| KR | 10-2020-0077671 | 7/2020 |
| KR | 10-2020-0088946 | 7/2020 |
| KR | 10-2021-0029337 | 3/2021 |
| KR | 10-2021-0056483 | 5/2021 |
| KR | 10-2021-0057891 | 5/2021 |
| WO | WO-2020017718 A1 * | 1/2020 ........... H10H 20/831 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0074337 under 35 U.S.C. § 119 filed on Jun. 8, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

As interest in an information display is increasing, research and development for a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of improving emission efficiency and simplifying a manufacturing process, and a method of manufacturing the same.

The disclosure is not limited to the above, and other technical objects will be clearly understood by those skilled in the art from the following description.

According to an embodiment, a display device may include a first alignment electrode and a second alignment electrode spaced apart from each other and disposed on a substrate; light emitting elements disposed between the first alignment electrode and the second alignment electrode; and an amorphous silicon layer disposed on the light emitting elements. The amorphous silicon layer may include an electrode portion disposed on a first end portion and a second end portion of each of the light emitting elements; and an insulating portion.

The electrode portion may include a dopant.

The dopant may include at least one of boron (B), aluminum (Al), gallium (Ga), and indium (In).

The electrode portion may include a first electrode portion disposed on the first end portion of each of the light emitting elements; and a second electrode portion disposed on the second end portion of each of the light emitting elements.

The insulating portion of the amorphous silicon layer may be disposed between the first electrode portion and the second electrode portion.

The display device may further include an insulating pattern disposed on the insulating portion of the amorphous silicon layer.

The insulating pattern may be disposed between the first electrode portion and the second electrode portion and may overlap the insulating portion of the amorphous silicon layer.

The first electrode portion may electrically contact the first end portion of each of the light emitting elements, and the second electrode portion may electrically contact the second end portion of each of the light emitting elements.

The first electrode portion may be electrically disconnected from the first alignment electrode.

The first electrode portion may be electrically connected to a transistor disposed on the substrate.

The first electrode portion may be electrically connected to the transistor through a contact hole passing through a protective layer and a via layer disposed on the transistor.

The first electrode portion may electrically connect the first alignment electrode to the first end portion of each of the light emitting elements.

The display device may further include a first connection electrode disposed on the first electrode portion; and a second connection electrode disposed on the second electrode portion.

The insulating portion of the amorphous silicon layer may expose the first end portion of each of the light emitting elements, and the electrode portion may be disposed on the second end portion of each of the light emitting elements.

The display device may further include a connection electrode disposed on the first end portion of each of the light emitting elements.

According to an embodiment, a method of manufacturing a display device may include preparing a substrate including a first alignment electrode and a second alignment electrode; disposing light emitting elements between the first alignment electrode and the second alignment electrode; forming an amorphous silicon layer on the light emitting elements; forming an insulating layer on the amorphous silicon layer; forming a mask pattern on the insulating layer; forming an insulating pattern by removing the insulating layer exposed by the mask pattern; and forming an electrode portion on a first end portion and a second end portion of each of the light emitting elements by implanting a dopant into the amorphous silicon layer exposed by the insulating pattern.

Forming of the electrode portion may include forming a first electrode portion by doping the amorphous silicon layer disposed on the first end portion of each of the light emitting elements; and forming a second electrode portion by doping the amorphous silicon layer disposed on the second end portion of each of the light emitting elements.

The amorphous silicon layer may include an insulating portion overlapping the mask pattern.

The insulating portion of the amorphous silicon layer may not be doped in the implanting of the dopant into the amorphous silicon layer.

The dopant may include at least one of boron (B), aluminum (Al), gallium (Ga), and indium (In).

Details of other embodiments are included in the detailed description and drawings.

According to an embodiment of the disclosure, even though a separation surface or a surface of an end portion of light emitting elements is not uniformly formed in a process of separating the light emitting elements from a wafer, an electrode portion formed of an amorphous silicon layer may be in contact with the end portion of the light emitting elements entirely. For example, since the contact area with the electrode portion may be secured regardless of a shape of the separation surface of the light emitting elements, emission efficiency may be improved.

Since a mask process for forming each of electrodes and an insulating layer may be omitted by simultaneously forming an electrode portion and an insulating portion by partially doping a dopant to amorphous silicon, a manufacturing process may be simplified.

An effect or effects according to embodiments is/are not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
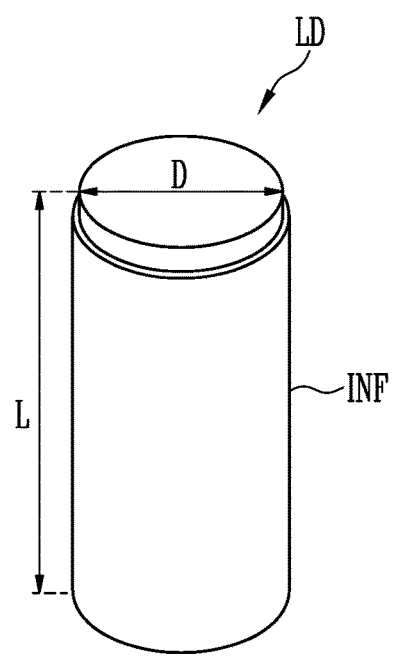
FIGS. 1 and 2 are schematic perspective and cross-sectional views illustrating a light emitting element according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and so that those skilled in the art to which the disclosure pertains can fully understand the scope of the disclosure. The disclosure may be defined by the scope of the claims.

In the drawings, sizes, thicknesses, ratios, and dimensions of the elements may be exaggerated for ease of description and for clarity. Like numbers refer to like elements throughout.

The term used in the specification is for describing embodiments and is not intended to limit the disclosure. In the specification, the singular form also includes the plural form unless otherwise specified.

For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote to the same components throughout the specification.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Although a first, a second, and the like are used to describe various components, these components are not limited by these terms. These terms are used only to distinguish one component from another component. Therefore, a first component described below may be a second component within the technical spirit of the disclosure.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure are described in detail with reference to the accompanying drawings.

Figure 2:
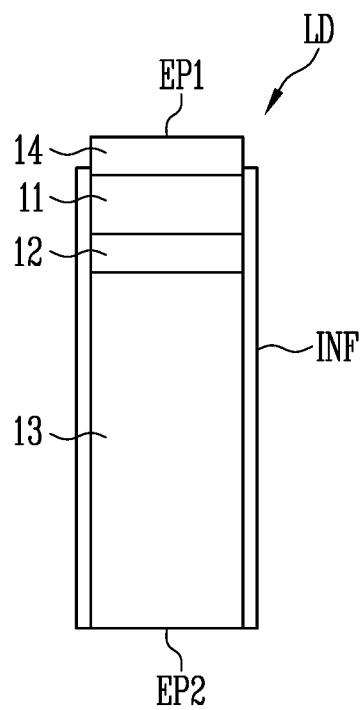

FIGS. 1 and 2 are schematic perspective and cross-sectional views illustrating a light emitting element according to an embodiment. FIGS. 1 and 2 show a column shape light emitting element LD, but a type and/or a shape of the light emitting element LD are/is not limited thereto. It is to be understood that the shapes described herein may also include shapes substantial to the shapes disclosed herein.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along one direction or a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In a process of manufacturing the light emitting element LD, in case that the light emitting elements LD are separated from a wafer, a separation surface of the light emitting elements LD, for example, a surface of at least one of the first and second end portions EP1 and EP2 may not be uniformly formed. Accordingly, in case that electrodes are formed on the first and second end portions EP1 and EP2 of the light emitting elements LD, a contact resistance may increase due to a contact area reduction of the separation surface of the light emitting elements LD and the electrodes, and thus emission efficiency such as non-emission may be reduced. In order to prevent such contact failure, electrode portions SE1 and SE2 of FIG. 5 may be formed using an amorphous silicon layer SL of FIG. 5 on the separation surface of at least one of the first and second end portions EP1 and EP2 of the light emitting elements LD. Accordingly, even though the separation surface of the light emitting elements LD is not uniformly formed, since the contact area may be secured regardless of a shape of the separation surfaces, emission efficiency may be improved. A detailed description thereof is described later with reference to FIG. 5 and the like within the spirit and the scope of the disclosure.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, or AlN, and may include a p-type semiconductor layer doped with a first conductivity type dopant such as boron (B), aluminum (Al), gallium (Ga), or indium (In). However, the material forming the first semiconductor layer 11 is not limited thereto, and various other materials may form the first semiconductor layer 11.

The active layer 12 may be disposed between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but is not limited thereto. The active layer 12 may include GaN, InGaN, InAlGaN, AlGaN, or AlN, and various other materials may form the active layer 12.

In case that a voltage equal to or greater than a threshold voltage is applied to both ends of the light emitting element LD, an electron-hole pair is combined in the active layer 12 and thus the light emitting element LD emits light. By controlling emission of the light emitting element LD using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, and AlN, and may include an n-type semiconductor layer doped with a second conductivity type dopant such as phosphorus (P), arsenic (As), or antimony (Sb). However, the material forming the second semiconductor layer 13 is not limited thereto, and the second semiconductor layer 13 may be formed of various other materials.

The electrode layer 14 may be disposed on the first end portion EP1 and/or the second end portion EP2 of the light emitting element LD. FIG. 2 illustrates a case in which the electrode layer 14 is formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted to the outside of the light emitting element LD.

An insulating layer INF may be provided on a surface of the light emitting element LD. The insulating film INF may be disposed on or directly disposed on a surface of the first semiconductor layer 11, the active layer 12, the second semiconductor layer 13, and/or the electrode layer 14. The insulating film INF may expose the first and second end portions EP1 and EP2 of the light emitting element LD having different polarities. According to an embodiment, the insulating film INF may expose a side portion of the electrode layer 14 and/or the second semiconductor layer 13 adjacent to the first and second end portions EP1 and EP2 of the light emitting element LD.

The insulating layer INF may prevent an electrical short that may occur in case that the active layer 12 comes into contact with a conductive material except for the first and second semiconductor layers 11 and 13. The insulating layer INF may minimize a surface defect of the light emitting elements LD, thereby improving lifespan and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulating film INF may be formed of a double layer, and each layer forming the double layer may include different materials. For example, the insulating film INF may be formed of a double layer formed of aluminum oxide ($AlO_x$) and silicon oxide ($SiO_x$), but is not limited thereto. According to an embodiment, the insulating film INF may be omitted.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like within the spirit and the scope of the disclosure.

The light emitting element LD may be a light emitting element manufactured in a column shape through an etching method or the like within the spirit and the scope of the disclosure. In the specification, the column shape may include a rod-like shape or a bar-like shape of which an aspect ratio is greater than 1, such as a circular column or a polygonal column, and the shape of the cross-section thereof is not limited.

A light emitting device including the light emitting element LD described above may be used in various types of devices that require a light source, including a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
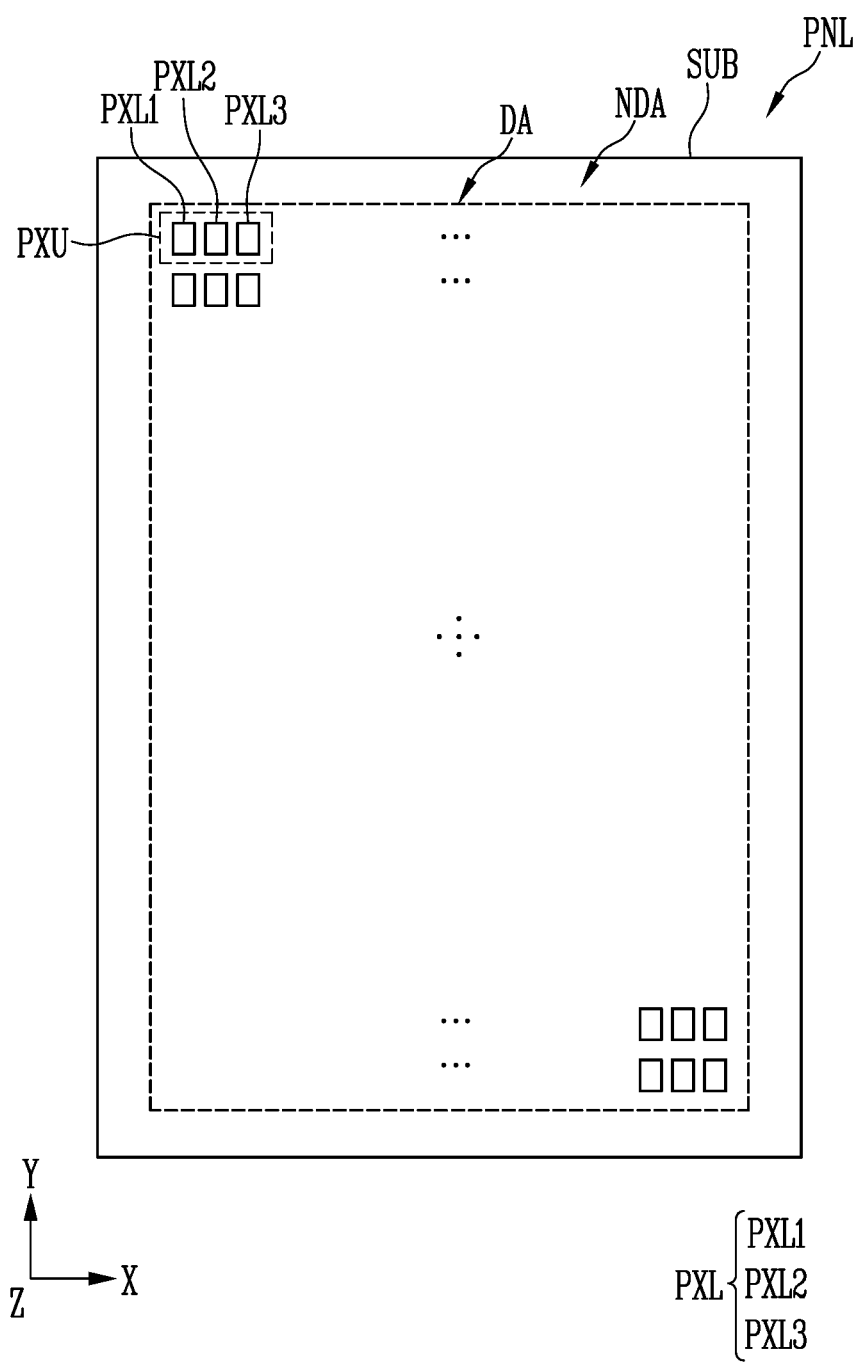
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described in the embodiments of FIGS. 1 and 2 as a light source, a display device, for example, a display panel PNL provided in the display device is shown.

Each pixel or pixel unit PXU of the display panel PNL and each pixel forming each pixel unit PXU may include at least one light emitting element LD. For convenience of description, in FIG. 3, a structure of the display panel PNL is shown based on a display area DA. However, according to an embodiment, at least one driving circuit or driving circuit unit (for example, at least one of a scan driver and a data driver), lines, and/or pads, which are/is not shown, may be further disposed on the display panel PNL.

Referring to FIG. 3, the display panel PNL may include a substrate SUB and a pixel unit PXU disposed on the substrate SUB. The pixel unit PXU may include first pixels PXL1, second pixels PXL2, and/or third pixels PXL3. Hereinafter, in case that at least one pixel among the first pixels PXL1, the second pixels PXL2, and the third pixels PXL3 is arbitrarily referred to, or in case that two or more types of pixels are collectively referred to, at least one or two or more types of pixels may be referred to as a "pixel (PXL)" or "pixels PXL".

The substrate SUB may form a base member of the display panel PNL, and may be a rigid or flexible substrate or film. For example, the substrate SUB may be a rigid substrate formed of glass or tempered glass, or a flexible substrate (or a thin film) of a plastic or metal material, and the material and/or a physical property of the substrate SUB are/is not limited.

The display panel PNL and the substrate SUB for forming the display panel PNL may include the display area DA for displaying an image and a non-display area NDA except for the display area DA. The pixels PXL may be disposed in the display area DA. Various lines, pads, and/or a built-in circuit or a built-in circuit unit connected to the pixels PXL of the display area DA may be disposed in the non-display area NDA. The pixels PXL may be regularly arranged or disposed according to a stripe or PENTILE™ arrangement structure, or the like within the spirit and the scope of the disclosure. However, the arrangement structure of the pixels PXL is not limited thereto, and the pixels PXL may be arranged or disposed in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged or disposed. At least one of the first to third pixels PXL1, PXL2, and PXL3 arranged or disposed to be adjacent to each other may form one pixel unit PXU that emits light of various colors. For example, each of the first to third pixels PXL1, PXL2, and PXL3 may be a sub pixel emitting light of a color. According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include light emitting elements that emit light of a same color, and may include a color conversion layer and/or a color filter of different colors disposed on the respective light emitting element, to emit light of the first color, the second color, and the third color, respectively. In an embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color, type, number, and/or the like of pixels PXL forming each pixel unit PXU are/is not limited. For example, the color of light emitted by each pixel PXL may be variously changed.

The pixel PXL may include at least one light source driven by a control signal (for example, a scan signal and a data signal) and/or power (for example, first power and second power). In an embodiment, the light source may include at least one light emitting element LD according to any one of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In an embodiment, each pixel PXL may be formed as an active pixel. However, a type, a structure, and/or a driving method of the pixels PXL applicable to the display device are/is not limited. For example, each pixel PXL may be formed as a pixel of a passive or active light emitting display device of various structures and/or driving methods.

Figure 4:
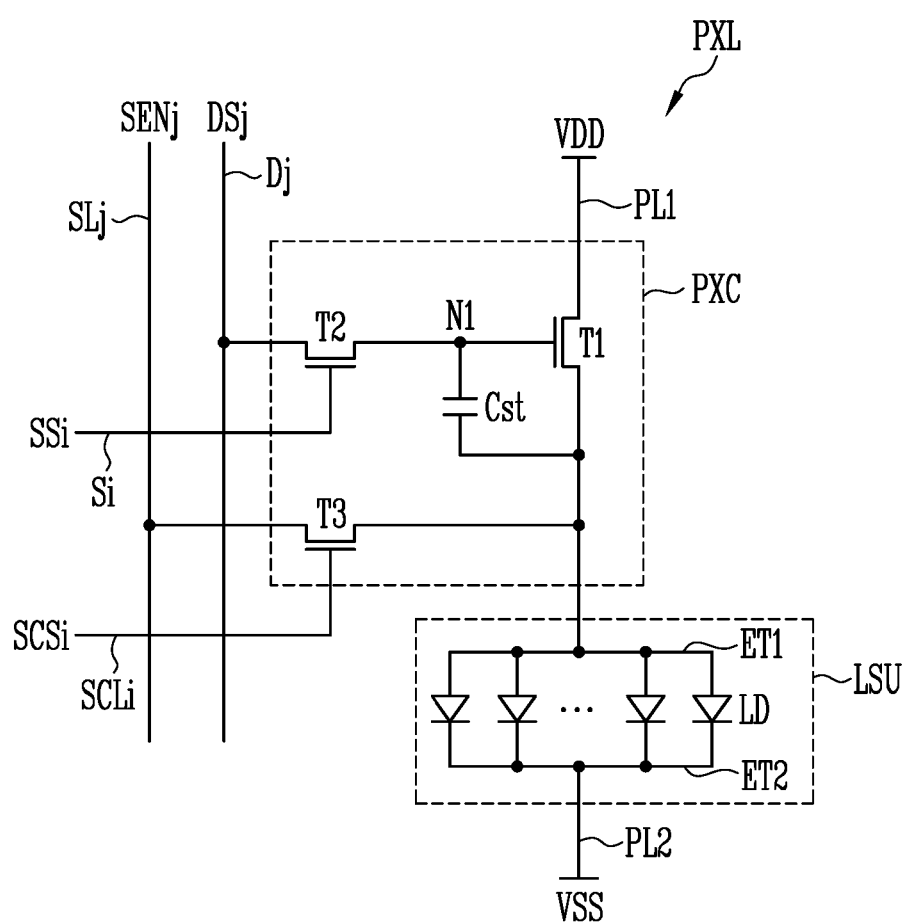
FIG. 4 is a schematic diagram of an equivalent circuit of a pixel according to an embodiment.

FIG. 4 is a schematic diagram of an equivalent circuit of a pixel according to an embodiment.

According to an embodiment, the pixel PXL shown in FIG. 4 may be any one of the first pixel PXL1, the second pixel PXL2, and the third pixel PXL3 provided in the display panel PNL of FIG. 1. The first pixel PXL1, the second pixel PXL2, and the third pixel PXL3 may have a structure substantially the same as or similar to each other.

Referring to FIG. 4, the pixel PXL may include a light emitting unit LSU for generating light of a luminance corresponding to a data signal, and a pixel circuit PXC for driving the light emitting unit LSU.

The light emitting unit LSU may include at least one light emitting element LD connected between first power VDD and second power VSS. For example, the light emitting unit LSU may include a first electrode ET1 connected to the first power VDD through the pixel circuit PXC and a first power line PL1, a second electrode ET2 connected to the second power VSS through a second power line PL2, and light emitting elements LD electrically connected between the first and second electrodes ET1 and ET2. In an embodiment, the first electrode ET1 may be an anode electrode, and the second electrode ET2 may be a cathode electrode.

Each of the light emitting elements LD may include the first end portion connected to the first power VDD through the first electrode ET1 and/or the pixel circuit PXC, and the second end portion connected to the second power VSS through the second electrode ET2. For example, the light emitting elements LD may be connected in a forward direction between the first and second electrodes ET1 and ET2. Each light emitting element LD connected in the forward direction between the first power VDD and the second power VSS may form a respective effective light source, and the effective light sources may be collected to form the light emitting unit LSU of the pixel PXL.

The first power VDD and the second power VSS may have different potentials so that the light emitting elements LD may emit light. For example, the first power VDD may be set as a high potential power, and the second power VSS may be set as a low potential power. At this time, a potential difference between the first power VDD and the second power VSS may be set to be greater than or equal to a threshold voltage of the light emitting elements LD during at least emission period of the pixel PXL.

One end portion or an end portion of the light emitting elements LD forming each light emitting unit LSU may be commonly connected to the pixel circuit PXC through one electrode (for example, the first electrode ET1 of each pixel PXL) of the light emitting unit LSU, and may be connected to the first power VDD through the pixel circuit PXC and the first power line PL1. Another end portion of the light emitting elements LD may be commonly connected to the second power VSS through another electrode (for example, the second electrode ET2 of each pixel PXL) of the light emitting unit LSU and the second power line PL2.

The light emitting elements LD may emit light with a luminance corresponding to a driving current supplied through the corresponding pixel circuit PXC. For example, during each frame period, the pixel circuit PXC may supply the driving current corresponding to a grayscale value to be expressed in a corresponding frame to the light emitting unit LSU. The driving current supplied to the light emitting unit LSU may be divided and flow through the light emitting elements LD connected in the forward direction. Accordingly, the light emitting unit LSU may emit light of the luminance corresponding to the driving current while each light emitting element LD emits light with a luminance corresponding to a current flowing therein.

The pixel circuit PXC may be connected between the first power VDD and the first electrode ET1. The pixel circuit PXC may be connected to a scan line Si and a data line Dj of a corresponding pixel PXL. For example, in case that the pixel PXL is disposed on an i-th (i is a natural number) horizontal line (row) and a j-th (j is a natural number) vertical line (column) of the display area DA, the pixel circuit PXC may be connected to the i-th scan line Si and the j-th data line Dj of the display area DA.

According to an embodiment, the pixel circuit PXC may include transistors T1, T2, and T3 and at least one storage capacitor Cst.

The first transistor T1 may be connected between the first power VDD and the light emitting unit LSU. For example, a first electrode (for example, a drain electrode) of the first transistor T1 may be connected to the first power VDD, and a second electrode (for example, a source electrode) of the first transistor T1 may be connected to the first electrode ET1. A gate electrode of the first transistor T1 may be connected to a first node N1. The first transistor T1 may control the driving current supplied to the light emitting unit LSU in response to a voltage of the first node N1. For example, the first transistor T1 may be a driving transistor that controls the driving current of the pixel PXL.

The second transistor T2 may be connected between the data line Dj and the first node N1. For example, a first electrode of the second transistor T2 may be connected to the data line Dj, and a second electrode of the second transistor T2 may be connected to the first node N1. A gate electrode of the second transistor T2 may be connected to the scan line Si. The second transistor T2 may be turned on in case that a scan signal SSi of a gate-on voltage (for example, a high level voltage) is supplied from the scan line Si, to electrically connect the data line Dj and the first node N1.

In each frame period, a data signal DSj of the corresponding frame may be supplied to the data line Dj, and the data signal DSj may be transferred to the first node N1 through the second transistor T2 turned on during a period in which the scan signal SSi of the gate-on voltage is supplied. For example, the second transistor T2 may be a switching transistor for transferring each data signal DSj to an inside of the pixel PXL.

The third transistor T3 may be connected between the first transistor T1 and a sensing line SLj. For example, one electrode of the third transistor T3 may be connected to the second electrode (for example, the source electrode) of the first transistor T1 connected to the first electrode ET1, and another electrode of the third transistor T3 may be connected to the sensing line SLj. In case that the sensing line SLj is omitted, the other electrode of the third transistor T3 may be connected to the data line Dj.

A gate electrode of the third transistor T3 may be connected to a sensing control line SCLi. In case that the sensing control line SCLi is omitted, the gate electrode of the third transistor T3 may be connected to the scan line Si. The third transistor T3 may be turned on by a sensing control signal SCSi of a gate-on voltage (for example, a high level voltage) supplied to the sensing control line SCLi during a sensing period, to electrically connect the sensing line SLj and the first transistor T1.

According to an embodiment, a sensing period may be a period in which a characteristic (for example, a threshold voltage or the like of the first transistor T1) of each of the pixels PXL disposed in the display area DA is extracted. During the sensing period, the first transistor may be turned on by supplying a reference voltage, at which the first transistor T1 may be turned on, to the first node N1 through the data line Dj and the second transistor T2, or connecting each pixel PXL to a current source or the like within the spirit and the scope of the disclosure. The third transistor T3 may be turned on by supplying the sensing control signal SCSi of the gate-on voltage to the third transistor T3, to connect the first transistor T1 to the sensing line SLj. Thereafter, a sensing signal SENj may be obtained through the sensing line SLj, and the characteristic of each pixel PXL including the threshold voltage or the like of the first transistor T1 may be detected using the sensing signal SENj. Information on the characteristic of each pixel PXL may be used to convert image data so that a characteristic deviation between the pixels PXL disposed in the display area DA may be compensated.

One electrode of the storage capacitor Cst may be connected to the second electrode of the first transistor T1, and another electrode may be connected to the first node N1. The storage capacitor Cst may charge a voltage corresponding to the data signal DSj supplied to the first node N1 during each frame period.

Although FIG. 4 shows an embodiment in which all of the effective light sources, for example, the light emitting elements LD, forming each light emitting unit LSU, are connected in parallel, the disclosure is not limited thereto. For example, the light emitting unit LSU of each pixel PXL may be formed to include at least two or more stages of series structures. The light emitting elements forming each series stage may be connected in series with each other by at least one intermediate electrode.

Figure 5:
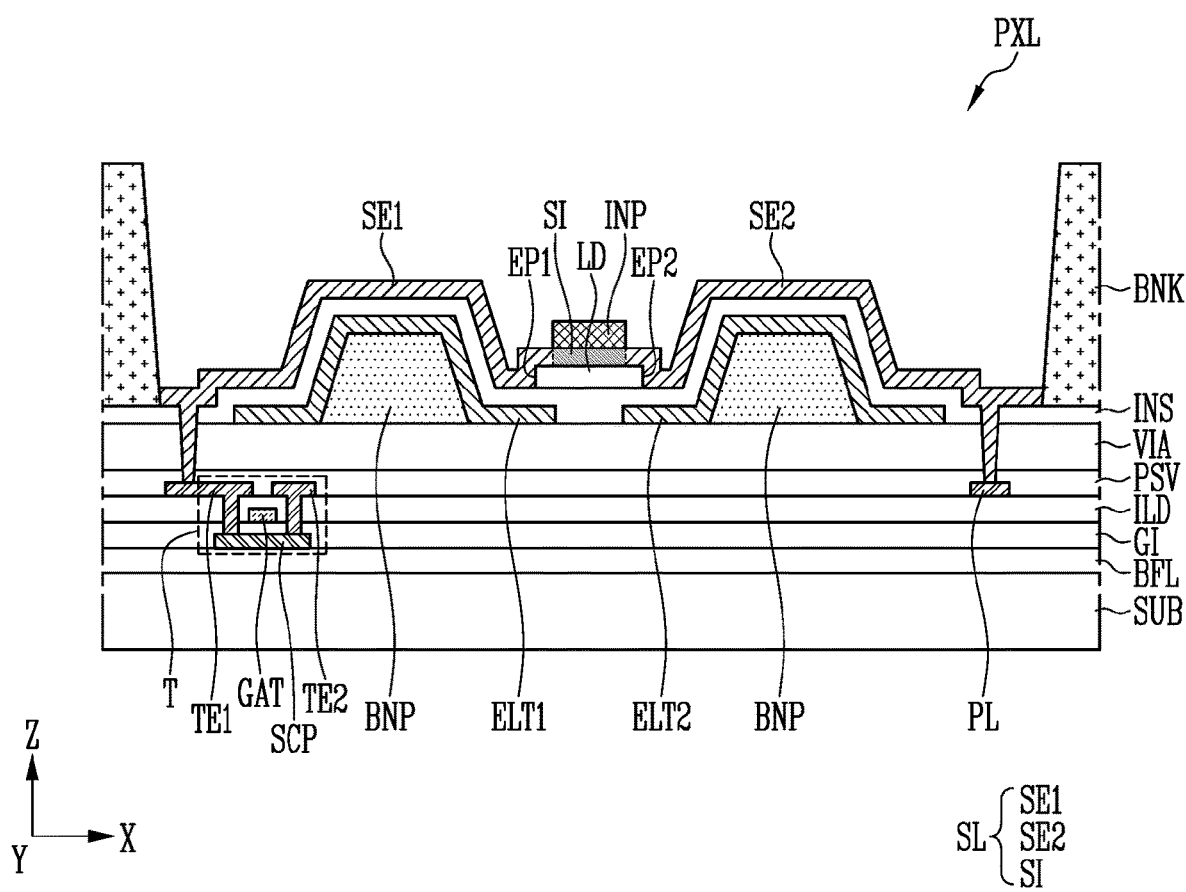
FIG. 5 is a schematic cross-sectional view illustrating a pixel according to an embodiment.

FIG. 5 is a schematic cross-sectional view illustrating a pixel according to an embodiment.

In FIG. 5, the first transistor T1 among various circuit elements forming the pixel circuit PXC of FIG. 4 is shown. In case that the first transistor T1 and the second transistor T2 are not required to be separately specified, the first transistor T1 and the second transistor T2 may collectively be referred to as a "transistor T". A structure, a position of each layer, and/or the like of the transistors T are/is not limited to an embodiment shown in FIG. 5, and may be variously changed according to an embodiment.

Referring to FIG. 5, circuit elements, for example, the transistors T and various lines connected thereto may be disposed on the substrate SUB of the pixels PXL and the display panel PNL including the same according to an embodiment. First and second alignment electrodes ELT1 and ELT2, the light emitting elements LD, and/or the first and second electrode portions SE1 and SE2 may be disposed on the circuit elements.

The substrate SUB may form a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. A material and/or a physical property of the substrate SUB are/is not limited. In an embodiment, the substrate SUB may be substantially transparent. Here, "substantially transparent" may mean that light may be transmitted at a transmittance or more. In an embodiment, the substrate SUB may be translucent or opaque. The substrate SUB may include a reflective material according to an embodiment.

The transistor T may be disposed on the substrate SUB. Each transistor T may include a semiconductor pattern SCP, a gate electrode GAT, and first and second transistor electrodes TE1 and TE2.

A buffer layer BFL may be disposed on the substrate SUB. The buffer layer BFL may prevent an impurity from being diffused into each circuit element. The buffer layer BFL may be formed of a single layer, but may be formed of multiple layers of at least two or more layers. In case that the buffer layer BFL is formed of multiple layers, each layer may be formed of the same material or similar material or may be formed of different materials.

The semiconductor pattern SCP may be disposed on the buffer layer BFL. For example, each semiconductor pattern SCP may include a first region contacting the first transistor electrode TE1, a second region contacting the second transistor electrode TE2, and a channel region positioned or disposed between the first and second regions. According to an embodiment, one of the first and second regions may be a source region and the other may be a drain region.

According to an embodiment, the semiconductor pattern SCP may be formed of amorphous silicon, oxide semiconductor, or the like within the spirit and the scope of the disclosure. The channel region of the semiconductor pattern SCP may be an intrinsic semiconductor as a semiconductor pattern that is not doped with a dopant. Each of the first and second regions of the semiconductor pattern SCP may be a semiconductor doped with a dopant.

A gate insulating layer GI may be disposed on the semiconductor pattern SCP. For example, the gate insulating layer GI may be disposed between the semiconductor pattern SCP and the gate electrode GAT. The gate insulating layer GI may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The gate electrode GAT may be disposed on the gate insulating layer GI. The gate electrode GAT may be disposed to overlap the semiconductor pattern SCP in a third direction (Z-axis direction) on the gate insulating layer GI.

An interlayer insulating layer ILD may be disposed on the gate electrode GAT. For example, the interlayer insulating layer ILD may be disposed between the gate electrode GAT and the first and second transistor electrodes TE1 and TE2. The interlayer insulating layer ILD may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first and second transistor electrodes TE1 and TE2 may be disposed on the interlayer insulating layer ILD. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the interlayer insulating layer ILD and the gate insulating layer GI. The second transistor electrode TE2 may be electrically connected to the second region of the semiconductor pattern SCP through a contact hole passing through the interlayer insulating layer ILD and the gate insulating layer GI. According to an embodiment, one of the first and second transistor electrodes TE1 and TE2 may be a source electrode, and the other may be a drain electrode.

A power line PL may be disposed on the interlayer insulating layer ILD. The power line PL may be disposed on a same layer as the first and second transistor electrodes TE1 and TE2. For example, the power line PL may be formed of a same conductive layer as the first and second transistor electrodes TE1 and TE2. For example, the power line PL may be formed simultaneously in a same process as the first and second transistor electrodes TE1 and TE2, but is not limited thereto.

A protective layer PSV may be disposed on the first and second transistor electrodes TE1 and TE2 and the power line PL. The protective layer PSV may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Although not shown in the drawings, a conductive layer may be added on the protective layer PSV according to an embodiment. The conductive layer may be electrically connected to the first and second transistor electrodes TE1 and TE2 and/or the power line PL, or may form various lines or circuit elements.

A via layer VIA may be disposed on the circuit elements including the transistors T. The via layer VIA may be formed of an organic material to flatten a lower step difference. For example, the via layer VIA may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the via layer VIA may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

On the via layer VIA, a bank BNK, bank patterns BNP, the first and second alignment electrodes ELT1 and ELT2, the light emitting elements LD, and/or the first and second electrode portions SE1 and SE2 may be provided.

The bank BNK may form a dam structure that partitions an emission area to which the light emitting elements LD are to be supplied in a step of supplying the light emitting elements LD to each of the pixels PXL. For example, a desired type and/or amount of light emitting element ink may be supplied to the area partitioned by the bank BNK.

The bank BNK may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank BNK may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

According to an embodiment, the bank BNK may include at least one light blocking and/or reflective material. Accordingly, light leakage between adjacent pixels PXL may be prevented. For example, the bank BNK may include at least one black matrix material, a color filter material, and/or the like within the spirit and the scope of the disclosure. For example, the bank BNK may be formed in a black opaque pattern that blocks transmission of light. In an embodiment, a reflective layer or the like, which is not shown, may be formed on a surface (for example, a sidewall) of the bank BNK so as to increase light efficiency of each pixel PXL.

The bank patterns BNP may be disposed in the area partitioned by the bank BNK. The bank patterns BNP may be disposed on a layer different from that of the bank BNK. For example, an insulating layer INS may be disposed on the bank patterns BNP, and the bank BNK may be disposed on the insulating layer INS. However, the disclosure is not limited thereto, and the bank patterns BNP may be disposed on a same layer as the bank BNK. The bank patterns BNP may be simultaneously formed in a same process as the bank BNK.

The bank patterns BNP may have various shapes according to an embodiment. In an embodiment, the bank patterns BNP may have a shape protruding from the substrate SUB in the third direction (Z-axis direction). The bank patterns BNP may be formed to have an inclined surface inclined at an angle with respect to the substrate SUB. However, the disclosure is not limited thereto, and the bank patterns BNP may have a sidewall of a curved surface, a step shape, or the like within the spirit and the scope of the disclosure. For example, the bank patterns BNP may have a cross section of a semicircle shape, a semi-ellipse shape, or the like within the spirit and the scope of the disclosure.

Electrodes and insulating layers disposed on the bank patterns BNP may have a shape corresponding to the bank patterns BNP. For example, the first and second alignment electrodes ELT1 and ELT2 disposed on the bank patterns BNP may include an inclined surface or a curved surface having a shape corresponding to the shape of the bank patterns BNP. Accordingly, the bank patterns BNP may function as a reflective member that improves emission efficiency of the display panel PNL by guiding the light emitted from the light emitting elements LD in the front direction, for example, the third direction (Z-axis direction) of the pixel PXL together with the first and second alignment electrodes ELT1 and ELT2 provided on the bank patterns BNP.

The bank patterns BNP may include at least one organic material and/or inorganic material. For example, the bank patterns BNP may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank patterns BNP may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first and second alignment electrodes ELT1 and ELT2 may be disposed on the protective layer PSV and the patterns BNP. The first and second alignment electrodes ELT1 and ELT2 may be disposed to be spaced apart from each other in the pixel PXL. As described above, the first and second alignment electrodes ELT1 and ELT2 may receive an alignment signal in an alignment step of the light emitting elements LD. Accordingly, an electric field may be formed between the first and second alignment electrodes ELT1 and ELT2, and thus the light emitting elements LD supplied to each of the pixels PXL may be aligned between the first and second alignment electrodes ELT1 and ELT2.

Each of the first and second alignment electrodes ELT1 and ELT2 may include at least one conductive material. For example, the first and second alignment electrodes ELT1 and ELT2 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), or gallium tin oxide (GTO), and at least one conductive material among conductive polymers such as PEDOT, but is not limited thereto.

The insulating layer INS may be disposed on the first and second alignment electrodes ELT1 and ELT2. The insulating layer INS may be formed of a single layer or multiple layers, and may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The light emitting elements LD may be disposed on the insulating layer INS. The light emitting elements LD may be disposed between the first and second alignment electrodes ELT1 and ELT2 on the insulating layer INS.

The light emitting elements LD may be prepared in a dispersed form in a light emitting element ink, and may be supplied to each of the pixels PXL through inkjet printing or the like within the spirit and the scope of the disclosure. For example, the light emitting elements LD may be dispersed in a volatile solvent and may be provided to each of the pixels PXL. Subsequently, in case that the alignment signal is supplied through the first and second alignment electrodes ELT1 and ELT2, the electric field may be formed between the first and second alignment electrodes ELT1 and ELT2, and the light emitting elements LD may be aligned between the first and second alignment electrodes ELT1 and ELT2. After the light emitting elements LD are aligned, the solvent may be evaporated or removed by other methods to stably arrange or dispose the light emitting elements LD between the first and second alignment electrodes ELT1 and ELT2.

An amorphous silicon layer SL may be disposed on the light emitting elements LD. The amorphous silicon layer SL may include the first and second electrode portions SE1 and SE2 and an insulating portion SI.

The first electrode portion SE1 may be disposed on the first end portion EP1 of the light emitting elements LD and may be in contact with the first end portion EP1 of the light emitting elements LD. For example, the first electrode portion SE1 may function as the first electrode ET1 described with reference to FIG. 4.

The second electrode portion SE2 may be disposed on the second end portion EP2 of the light emitting elements LD and may be in contact with the second end portion EP2 of the light emitting elements LD. For example, the second electrode portion SE2 may function as the second electrode ET2 described with reference to FIG. 4.

Each of the first and second electrode portions SE1 and SE2 may include a dopant. The first and second electrode portions SE1 and SE2 formed of the amorphous silicon layer SL may become conductive by the dopant.

The first and second electrode portions SE1 and SE2 may be formed of amorphous silicon including an n-type dopant such as phosphorus (P), arsenic (As), or antimony (Sb). However, the disclosure is not limited thereto, and the n-type dopant may include any one of a group 15 element.

According to an embodiment, the first and second electrode portions SE1 and SE2 may be formed of amorphous silicon including a p-type dopant such as boron (B), aluminum (Al), gallium (Ga), or indium (In). However, the disclosure is not limited thereto, and the p-type dopant may include any one of a group 13 element.

As described above, in the process of separating the light emitting elements LD from the wafer, even though the separation surface of the light emitting elements LD, for example, a surface of at least one of the first and second end portions EP1 and EP2 is uniformly formed, the first and second electrode portions SE1 and SE2 may be in contact with the first and second end portions EP1 and EP2 of the light emitting elements LD entirely by forming the first and second electrode portions SE1 and SE2 using the amorphous silicon layer SL. For example, since the contact area with the first and second electrode portions SE1 and SE2 may be secured regardless of a shape of the separation surface of the light emitting elements LD, emission efficiency may be improved.

The insulating portion SI may be disposed between the first electrode portion SE1 and the second electrode portion SE2. The insulating portion SI may be partially disposed on the light emitting elements LD. For example, the insulating portion SI may not overlap the first and second end portions EP1 and EP2 of the light emitting elements LD. For example, the insulating portion SI may expose the first and second end portions EP1 and EP2 of the light emitting elements LD.

In an embodiment, the insulating portion SI may be formed of undoped amorphous silicon. As described above, in case that the insulating portion SI is provided or disposed between the first and second electrode portions SE1 and SE2, since the first and second electrode portions SE1 and SE2 may be electrically separated or disconnected, occurrence of a short defect may be effectively prevented. Since an additional process or the like of removing the amorphous silicon layer SL between the first and second electrode portions SE1 and SE2 in order to separate the first and second electrode portions SE1 and SE2 may be omitted, process economic feasibility may be secured.

As described above, in case that the first and second electrode portions SE1 and SE2 and the insulating portion SI are simultaneously formed by partially doping the amorphous silicon layer SL, since a mask process for forming separate electrodes connected to the end portions EP1 and EP2 of the light emitting elements LD, respectively, may be omitted, a manufacturing process may be simplified.

The first electrode portion SE1 may be electrically connected to the first transistor electrode TE1 of the transistor T through a contact hole passing through the above-described insulating layer INS, via layer VIA, and/or protective layer PSV. For example, the first electrode portion SE1 may be connected to or directly connected to the first transistor electrode TE1 of the transistor T without contacting the first alignment electrode ELT1. For example, the first electrode portion SE1 may be electrically separated or disconnected from the first alignment electrode ELT1. As described above, in case that the first electrode portion SE1 is connected to or directly connected to the first transistor electrode TE1, a contact resistance due to formation of an oxide film (for example, an aluminum oxide film) due to corrosion by contact between the first electrode portion SE1 and the first alignment electrode ELT1 may be prevented from being increased.

Similarly, the second electrode portion SE2 may be electrically connected to the power line PL through a contact hole passing through the above-described insulating layer INS, via layer VIA, and/or protective layer PSV. For example, the second electrode portion SE2 may be connected to or directly connected to the power line PL without contacting the second alignment electrode ELT2. For example, the second electrode portion SE2 may be electrically separated or disconnected from the second alignment electrode ELT2. As described above, in case that the second electrode portion SE2 is connected to or directly connected to the power line PL, a contact resistance due to formation of an oxide film (for example, an aluminum oxide film) due to corrosion by contact between the second electrode portion SE2 and the second alignment electrode ELT2 may be prevented from being increased.

The insulating pattern INP may be disposed on the amorphous silicon layer SL. For example, the insulating pattern INP may be disposed on the insulating portion SI of the amorphous silicon layer SL and overlap the insulating portion SI in the third direction (Z-axis direction). The insulating pattern INP may cover or overlap the insulating portion SI and may completely overlap the insulating portion SI in the third direction (Z-axis direction), but is not limited thereto. A width of the insulating pattern INP in a first direction (X-axis direction) may be substantially the same as a width of the insulating portion SI in the first direction (X-axis direction), but is not limited thereto. It is to be understood that the disclosure may further include a second direction (Y-axis direction).

The insulating pattern INP may include an inorganic material. For example, the insulating pattern INP may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto, and the insulating pattern INP may include an organic material including acrylates resin, an epoxy resin, a phenolic resin, a polyamides resin, a polyimide resin, a polyesters resin, polyphenylenesulfides resin, benzocyclobutene (BCB), or the like within the spirit and the scope of the disclosure.

Hereinafter, an embodiment is described. In the following embodiments, the same configuration as that already described is referred to by the same reference numeral, and a repetitive description is omitted or simplified.

Figure 6:
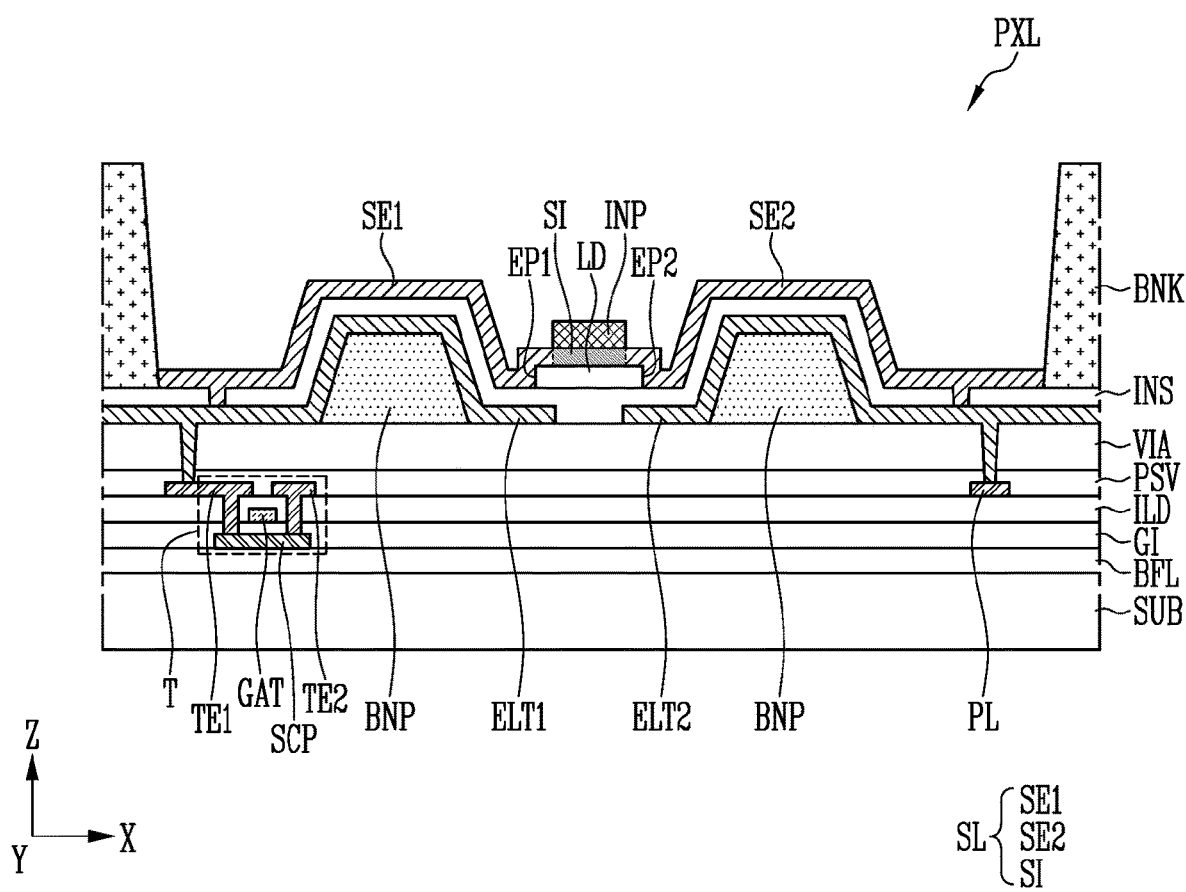
FIG. 6 is a schematic cross-sectional view illustrating a pixel according to an embodiment.

FIG. 6 is a schematic cross-sectional view illustrating a pixel according to an embodiment.

Referring to FIG. 6, the pixel PXL according to an embodiment may be different from an embodiment of FIGS. 1 to 5 in that the first and second electrode portions SE1 and SE2 may be electrically connected to the first and second alignment electrodes ELT1 and ELT2, respectively.

The first electrode portion SE1 may be electrically connected to the first alignment electrode ELT1 through a contact hole passing through the insulating layer INS. The first alignment electrode ELT1 may be electrically connected to the first transistor electrode TE1 of the transistor T through a contact hole passing through the via layer VIA and/or the protective layer PSV. For example, the first electrode portion SE1 may be electrically connected to the transistor T through the first alignment electrode ELT1.

The second electrode portion SE2 may be electrically connected to the second alignment electrode ELT2 through a contact hole passing through the insulating layer INS. The second alignment electrode ELT2 may be electrically connected to the power line PL through a contact hole passing through the via layer VIA and/or the protective layer PSV. For example, the second electrode portion SE2 may be electrically connected to the power line PL through the second alignment electrode ELT2.

By partially doping the amorphous silicon layer SL to form the first and second electrode portions SE1 and SE2 and the insulating portion SI, the emission efficiency may be improved and the manufacturing process may be simplified as described.

Figure 7:
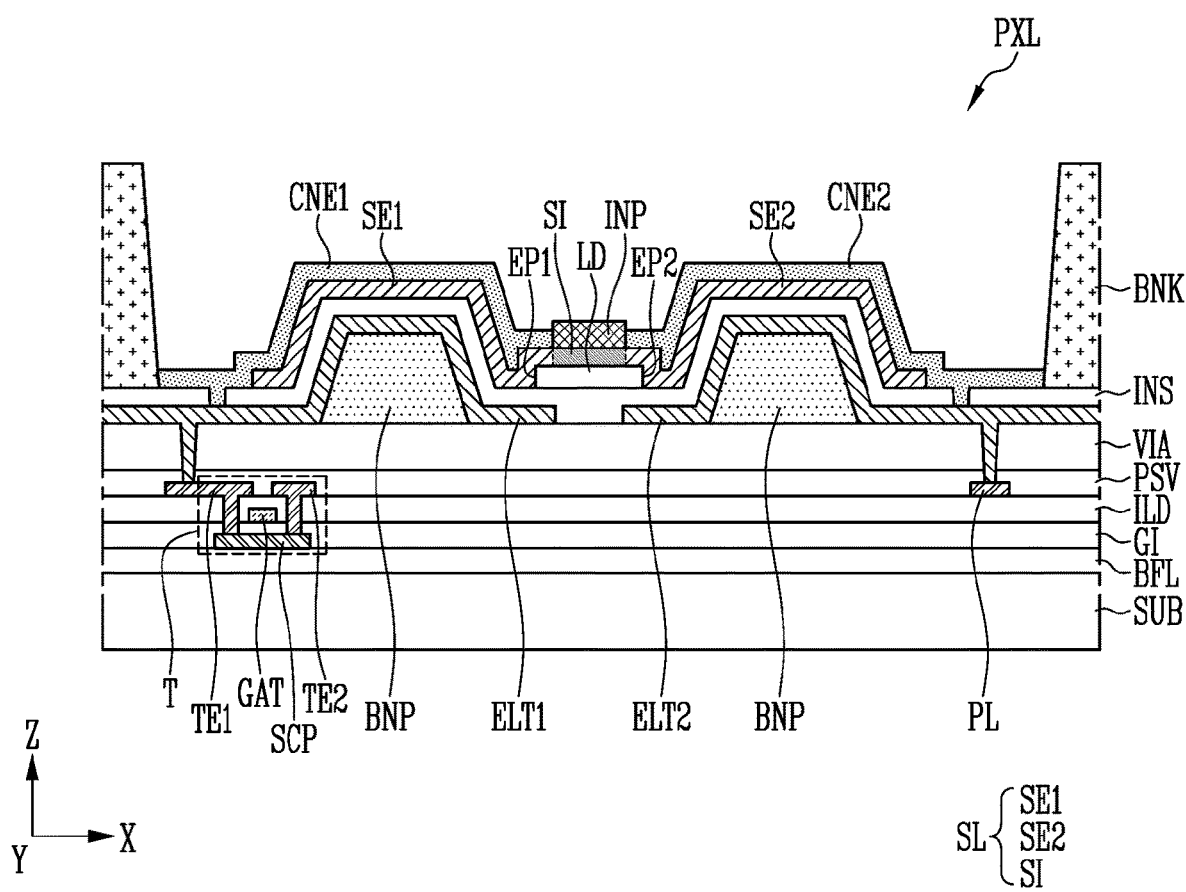
FIG. 7 is a schematic cross-sectional view illustrating a pixel according to an embodiment.

FIG. 7 is a schematic cross-sectional view illustrating a pixel according to an embodiment.

Referring to FIG. 7, the pixel PXL according to an embodiment may be different from an embodiment of FIGS. 1 to 5 in that the pixel PXL according to an embodiment may further include first and second connection electrodes CNE1 and CNE2 disposed on the amorphous silicon layer SL.

The first and second connection electrodes CNE1 and CNE2 may be disposed on the first and second electrode portions SE1 and SE2 of the amorphous silicon layer SL, respectively.

The first connection electrode CNE1 may be disposed on the first electrode portion SE1 exposed by the insulating pattern INP and may be in contact with the first electrode portion SE1. The first connection electrode CNE1 may be electrically connected to the first alignment electrode ELT1 through a contact hole passing through the insulating layer INS, and the first alignment electrode ELT1 may be electrically connected to the first transistor electrode TE1 of the transistor T through a contact hole passing through the via layer VIA and/or the protective layer PSV. For example, the first electrode portion SE1 may be electrically connected to the transistor T through the first connection electrode CNE1 and the first alignment electrode ELT1. However, the disclosure is not limited thereto. The first connection electrode CNE1 may be electrically connected to the first transistor electrode TE1 of the transistor T through a contact hole passing the insulating layer INS, the via layer VIA, and/or the protective layer PSV, and the first electrode portion SE1 may be electrically connected to the transistor T through the first connection electrode CNE1.

The second connection electrode CNE2 may be disposed on the second electrode portion SE2 exposed by the insulating pattern INP and may be in contact with the second electrode portion SE2. The second connection electrode CNE2 may be electrically connected to the second alignment electrode ELT2 through a contact hole passing through the insulating layer INS, and the second alignment electrode ELT2 may be electrically connected to the power line PL through a contact hole passing through the via layer VIA and/or protective layer PSV. For example, the second electrode portion SE2 may be electrically connected to the power line PL through the second connection electrode CNE2 and the second alignment electrode ELT2. However, the disclosure is not limited thereto. The second connection electrode CNE2 may be electrically connected to the power line PL through a contact hole passing through the insulating layer INS, the via layer VIA, and/or the protective layer PSV, and the second electrode portion SE2 may be electrically connected to the power line PL through the second connection electrode CNE2.

In an embodiment, the first and second connection electrodes CNE1 and CNE2 may be disposed on a same layer. For example, the first and second connection electrodes CNE1 and CNE2 may be formed of a same conductive layer. The first and second connection electrodes CNE1 and CNE2 may be simultaneously formed in a same process. However, the disclosure is not limited thereto, and the first and second connection electrodes CNE1 and CNE2 may be disposed on different layers. In an embodiment, the insulating pattern INP may be disposed between the first and second connection electrodes CNE1 and CNE2. The first and second connection electrodes CNE1 and CNE2 may be readily separated by the insulating pattern INP.

Each of the first and second connection electrodes CNE1 and CNE2 may be formed of various transparent conductive materials. For example, the first and second connection electrodes CNE1 and CNE2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance. Accordingly, light emitted from the first and second end portions EP1 and EP2 of the light emitting elements LD may pass through the first and second connection electrodes CNE1 and CNE2 and may be emitted to an outside of the display panel PNL.

Figure 8:
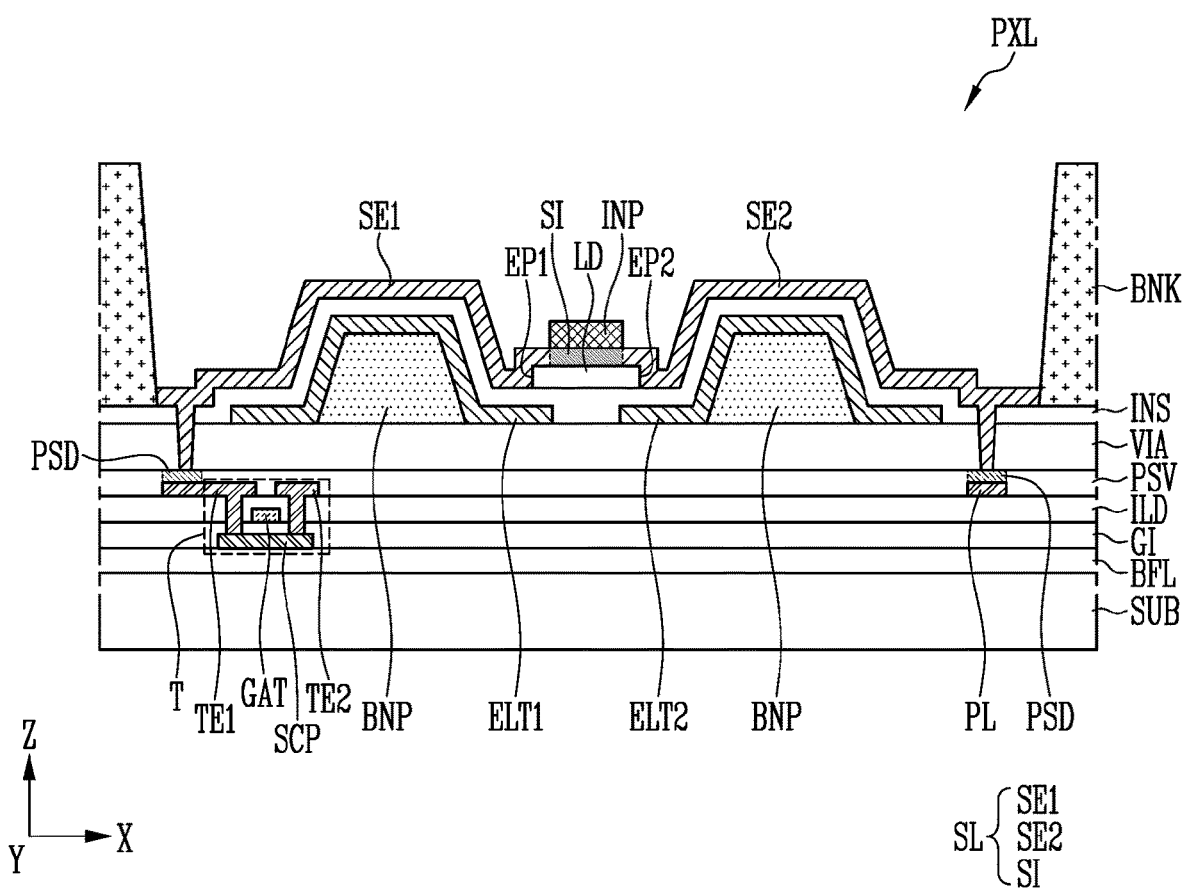
FIG. 8 is a schematic cross-sectional view illustrating a pixel according to an embodiment.

FIG. 8 is a c schematic ross-sectional view illustrating a pixel according to an embodiment.

Referring to FIG. 8, the pixel PXL according to an embodiment may be different from an embodiment of FIGS. 1 to 5 in that the protective layer PSV may include a contact portion PSD.

The contact portion PSD of the protective layer PSV may include a dopant. The contact portion PSD of the protective layer PSV may become conductive by the dopant. For example, the contact portion PSD of the protective layer PSV may include an n-type dopant such as phosphorus (P), arsenic (As), or antimony (Sb). However, the disclosure is not limited thereto, and the n-type dopant may include any one of a group 15 element.

According to an embodiment, the contact portion PSD of the protective layer PSV may include a p-type dopant such as boron (B), aluminum (Al), gallium (Ga), or indium (In). However, the disclosure is not limited thereto, and the p-type dopant may include any one of a group 13 element.

For example, the contact portion PSD of the protective layer PSV may be doped together in the process of forming the first and second electrode portions SE1 and SE2 by implanting the dopant into the above-described amorphous silicon layer SL. For example, the first and second electrode portions SE1 and SE2 may be formed by doping the amorphous silicon layer SL, and the contact portion PSD may be formed by doping the protective layer PSV disposed thereunder, simultaneously.

The first electrode portion SE1 may be electrically connected to the contact portion PSD through a contact hole passing through the above-described insulating layer INS and/or via layer VIA, and may be electrically connected to the first transistor electrode TE1 of the transistor T through the contact portion PSD. As described above, in case that the first electrode portion SE1 is electrically connected to the first transistor electrode TE1 through the contact portion PSD of the protective layer PSV without contacting the first transistor electrode TE1, a contact resistance due to formation of an oxide film (for example, an aluminum oxide film) due to corrosion by contact between the first electrode portion SE1 and the first transistor electrode TE1 may be prevented from being increased.

Similarly, the second electrode portion SE2 may be electrically connected to the contact portion PSD through a contact hole passing through the insulating layer INS and/or the via layer VIA, and may be electrically connected to the power line PL through the contact portion PSD. As described above, in case that the second electrode portion SE2 is electrically connected to the power line PL through the contact portion PSD of the protective layer PSV without contacting the power line PL, a contact resistance due to formation of an oxide film (for example, an aluminum oxide film) due to corrosion by contact between the second electrode portion SE2 and the power line PL may be prevented from being increased.

Figure 9:
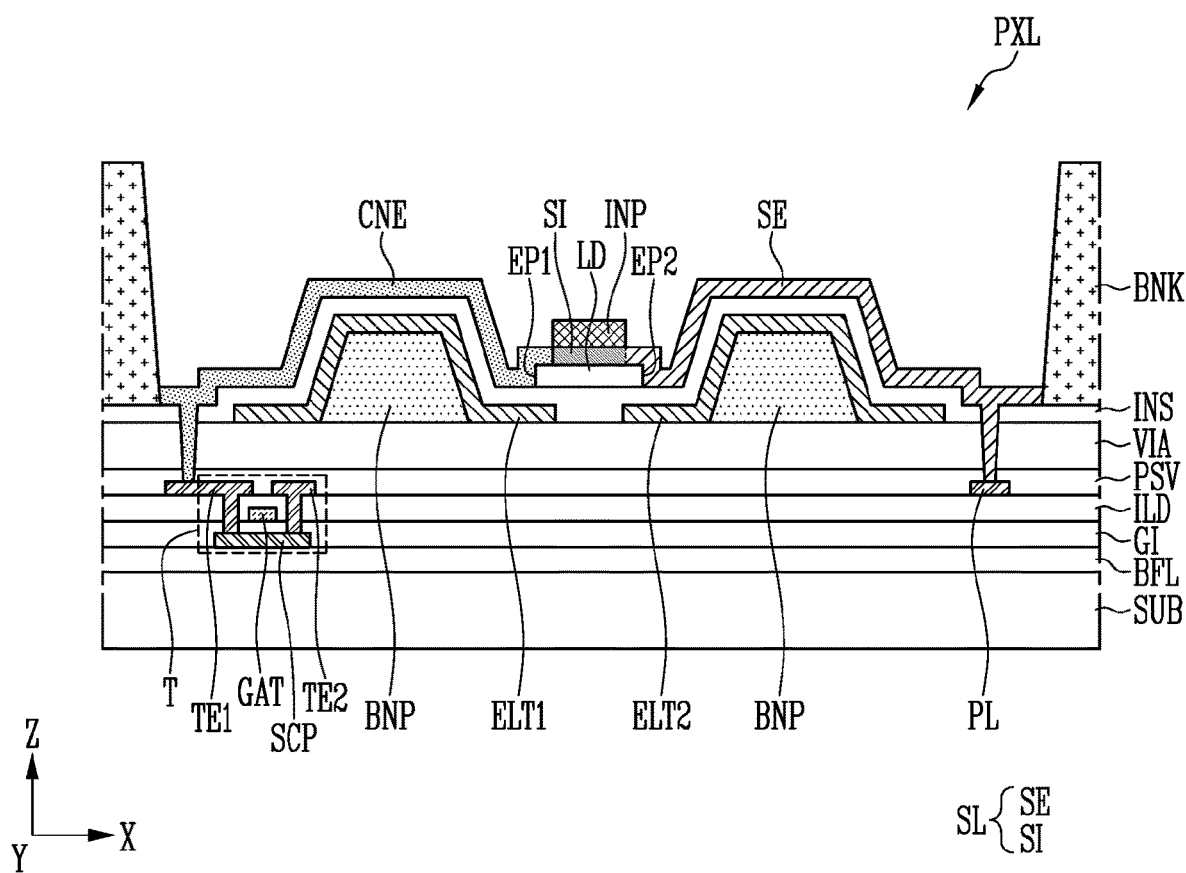
FIG. 9 is a schematic cross-sectional view illustrating a pixel according to an embodiment.

FIG. 9 is a schematic cross-sectional view illustrating a pixel according to an embodiment.

Referring to FIG. 9, the pixel PXL according to an embodiment may be different from an embodiment of FIGS. 1 to 5 in that the amorphous silicon layer SL may expose the first end portion EP1 of the light emitting elements LD and a connection electrode CNE may be disposed on the first end portion EP1 of the light emitting elements LD.

The amorphous silicon layer SL may include the insulating portion SI and an electrode portion SE. The insulating portion SI may be partially disposed on the light emitting elements LD. For example, the insulating portion SI may not overlap the first and second end portions EP1 and EP2 of the light emitting elements LD. For example, the insulating portion SI may expose the first and second end portions EP1 and EP2 of the light emitting elements LD. In an embodiment, the insulating portion SI may be formed of undoped amorphous silicon. As described above, in case that the undoped insulating portion SI is provided on the light emitting elements LD, the electrode portion SE disposed on one side or on a side and another side of the insulating portion SI and the connection electrode CNE may be electrically separated or disconnected from each other, and thus occurrence of a short defect may be effectively prevented as described above.

The electrode portion SE may be disposed on the second end portion EP2 of the light emitting elements LD and may be in contact with the second end portion EP2 of the light emitting elements LD. The electrode portion SE may be electrically connected to the power line PL through a contact hole passing through the insulating layer INS, the via layer VIA, and/or the protective layer PSV.

The electrode portion SE may include a dopant. For example, the electrode portion SE may be formed of amorphous silicon including an n-type dopant such as phosphorus (P), arsenic (As), or antimony (Sb). However, the disclosure is not limited thereto, and the electrode portion SE may be formed of amorphous silicon including a p-type dopant such as boron (B), aluminum (Al), gallium (Ga), or indium (In).

As described above, in the process of separating the light emitting elements LD from the wafer, even though the surface of the separation surface of the light emitting elements LD, for example, the surface of the second end portion EP2 is not uniformly formed, the second end portion EP2, which is the separation surface of the light emitting elements LD, and the electrode portion SE may be in contact with each other entirely. For example, since the contact area with the electrode portion SE may be secured regardless of the shape of the separation surface of the light emitting elements LD, the emission efficiency may be improved as described above.

The connection electrode CNE may be disposed on the first end portion EP1 of the light emitting elements LD exposed by the insulating portion SI of the amorphous silicon layer SL. The connection electrode CNE may be in contact with the first end portion EP1 of the light emitting elements LD. The connection electrode CNE may be electrically connected to the first transistor electrode TE1 of the transistor T through a contact hole passing through the insulating layer INS, the via layer VIA, and/or the protective layer PSV.

The connection electrode CNE may be formed of various transparent conductive materials. For example, the connection electrode CNE may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance. Accordingly, the light emitted from the first end portion EP1 of the light emitting elements LD may pass through the connection electrode CNE and may be emitted to the outside of the display panel PNL.

According to the above-described embodiment, the electrode portion SE may be formed on the second end portion EP2 that is the separation surface of the light emitting elements LD by using the amorphous silicon layer SL to prevent a contact defect, and the connection electrode CNE may be formed on the first end portion EP1 that does not correspond to the separation surface by using a transparent conductive material to minimize a light efficiency reduction.

Subsequently, a method of manufacturing the display device according to the above-described embodiments is described.

FIGS. 10 to 15 are schematic cross-sectional views illustrating a method of manufacturing a display device according to an embodiment.

FIGS. 10 to 15 are schematic cross-sectional views illustrating a method of manufacturing the display device of FIG. 5. Components substantially the same as those of FIG. 5 are denoted by the same reference numerals and detailed reference numerals are omitted.

Figure 10:
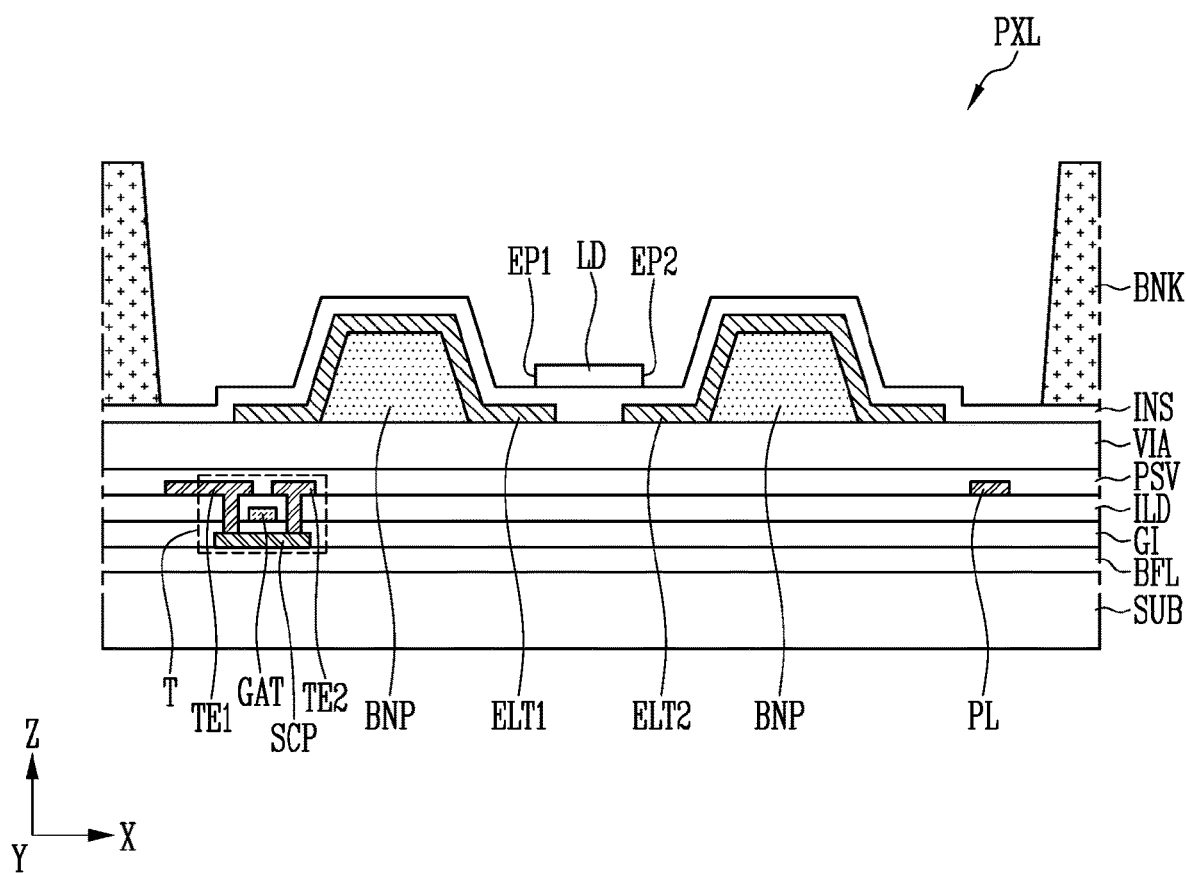
FIGS. 10 to 15 are schematic cross-sectional views illustrating a method of manufacturing a display device according to an embodiment.

Referring to FIG. 10, first, the substrate SUB including the first alignment electrode ELT1 and the second alignment electrode ELT2 is prepared, and the light emitting element LD is provided between the first and second alignment electrodes ELT1 and ELT2.

The insulating layer INS may be formed on the first and second alignment electrodes ELT1 and ELT2, and the light emitting elements LD may be aligned between the first and second alignment electrodes ELT1 and ELT2 on the insulating layer INS.

The light emitting elements LD may be prepared in a dispersed form in the light emitting element ink, and may be supplied to each pixel PXL through an inkjet printing method or the like within the spirit and the scope of the disclosure. For example, the light emitting elements LD may be dispersed in a volatile solvent and may be provided to the pixel PXL. Subsequently, in case that the alignment signal is supplied to the first and second alignment electrodes ELT1 and ELT2, the electric field may be formed between the first and second alignment electrodes ELT1 and ELT2, and thus the light emitting elements LD may be aligned between the first and second alignment electrodes ELT1 and ELT2. After the light emitting elements LD are aligned, the solvent may be evaporated or removed by other methods to stably arrange or dispose the light emitting elements LD between the first and second alignment electrodes ELT1 and ELT2.

Figure 11:
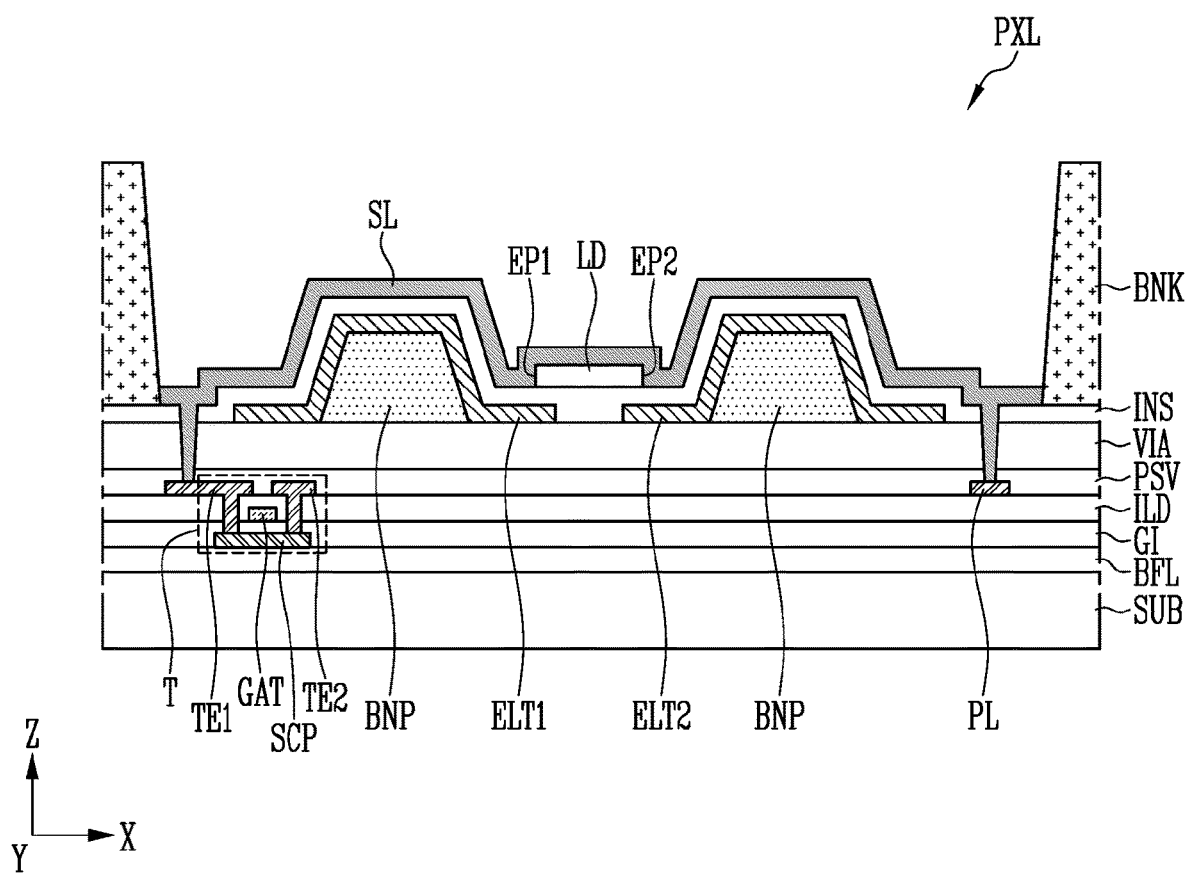

Referring to FIG. 11, subsequently, the amorphous silicon layer SL is formed on the light emitting elements LD. The amorphous silicon layer SL may cover or overlap the entire first and second end portions EP1 and EP2 of the light emitting elements LD. The amorphous silicon layer SL may be in contact with the transistor T and/or the power line PL thereunder through contact holes passing through the insulating layer INS, the via layer VIA, and/or the protective layer PSV. The amorphous silicon layer SL may be formed over the entire surface of the substrate SUB, but is not limited thereto.

Figure 12:
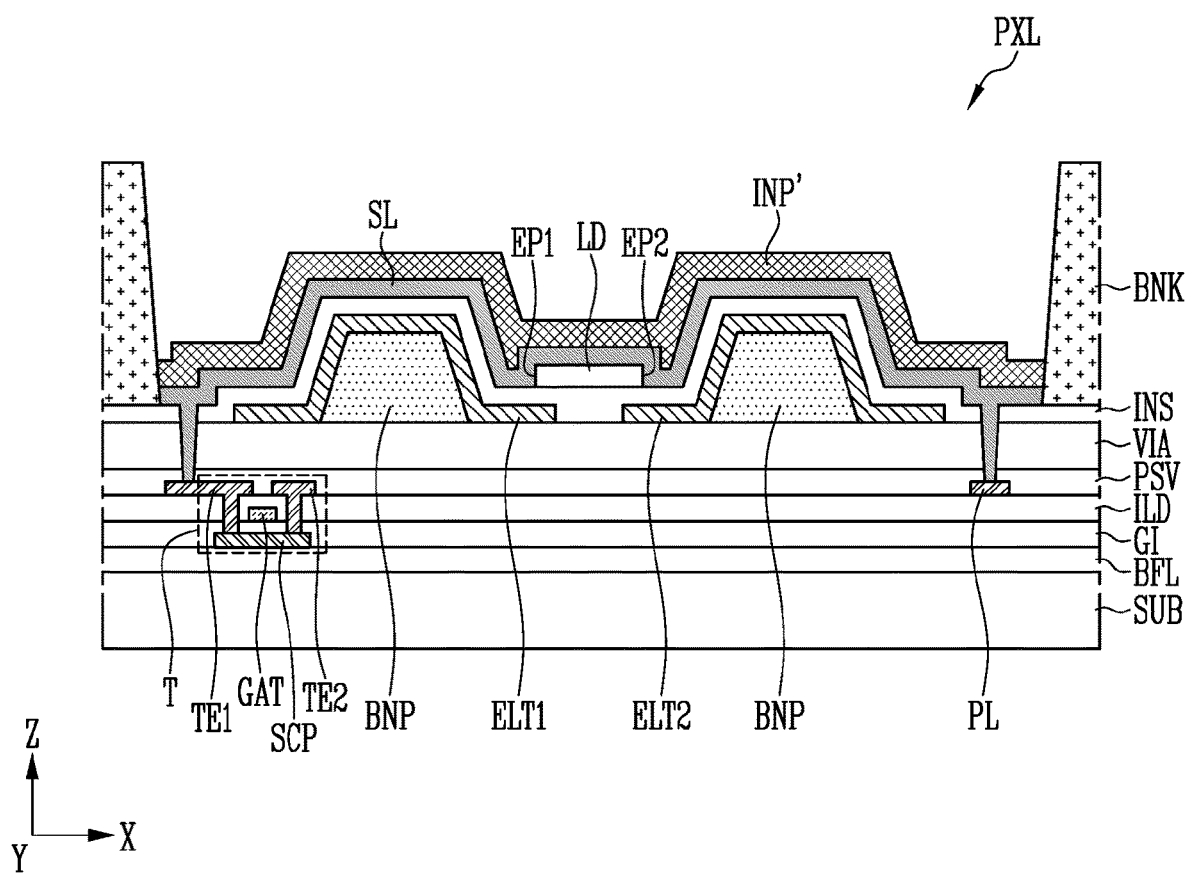

Referring to FIG. 12, an insulating pattern layer INP' is formed on the amorphous silicon layer SL. The insulating pattern layer INP' may entirely cover or overlap the amorphous silicon layer SL. The insulating pattern layer INP' may be formed over the entire surface of the substrate SUB, but is not limited thereto.

The insulating pattern layer INP' may include an inorganic material. For example, the insulating pattern layer INP' may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto, and the insulating pattern INP' may include an organic material including acrylates resin, an epoxy resin, a phenolic resin, a polyamides resin, a polyimide resin, a polyesters resin, polyphenylenesulfides resin, benzocyclobutene (BCB), or the like within the spirit and the scope of the disclosure.

Figure 13:
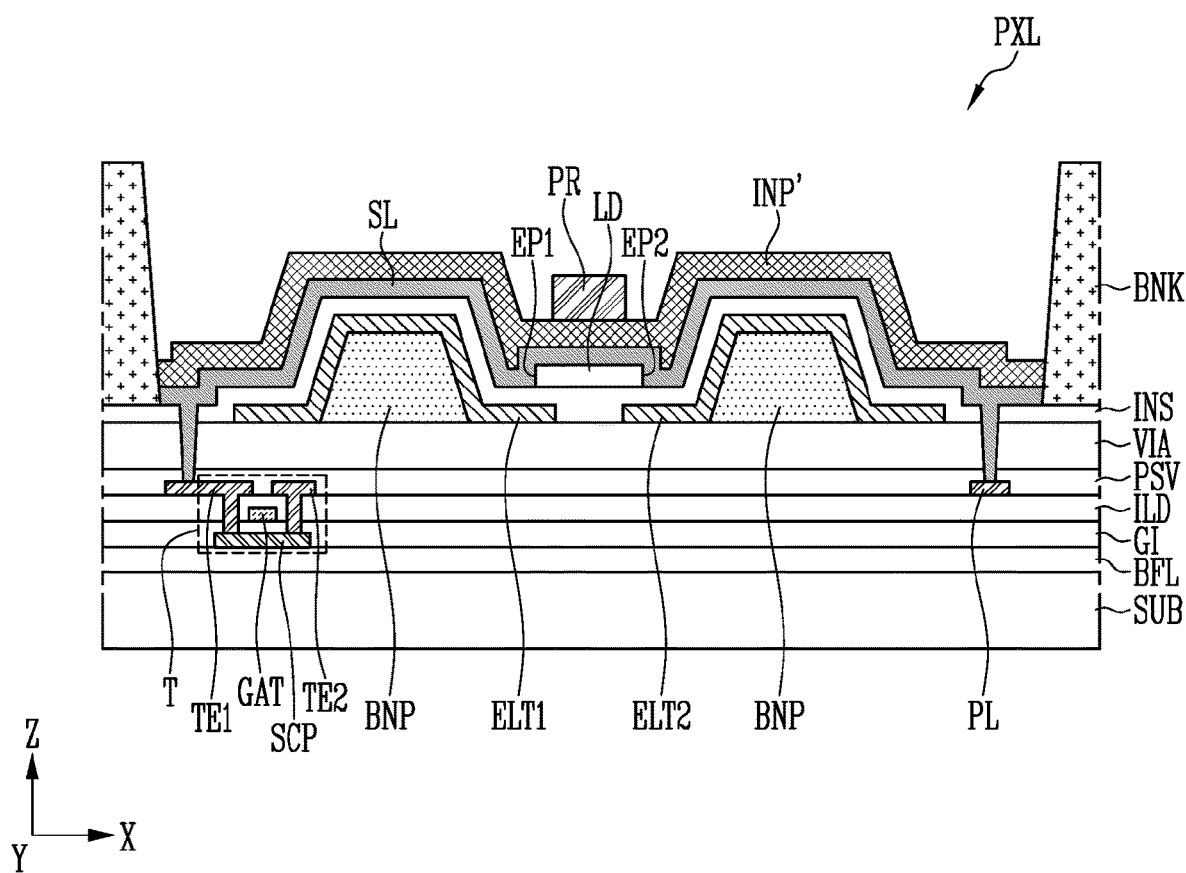

Referring to FIG. 13, subsequently, a mask pattern PR is formed on the insulating pattern layer INP'. The mask pattern PR may partially overlap the light emitting elements LD in the third direction (Z-axis direction) on the insulating pattern layer INP'. For example, the mask pattern PR may be formed on the light emitting elements LD on the insulating pattern layer INP', and may be formed so as not to overlap the first and second end portions EP1 and EP2 of the light emitting elements LD in the direction (Z-axis direction). For example, the mask pattern PR may be formed to expose the first and second end portions EP1 and EP2 of the light emitting elements LD on the insulating pattern layer INP'.

Figure 14:
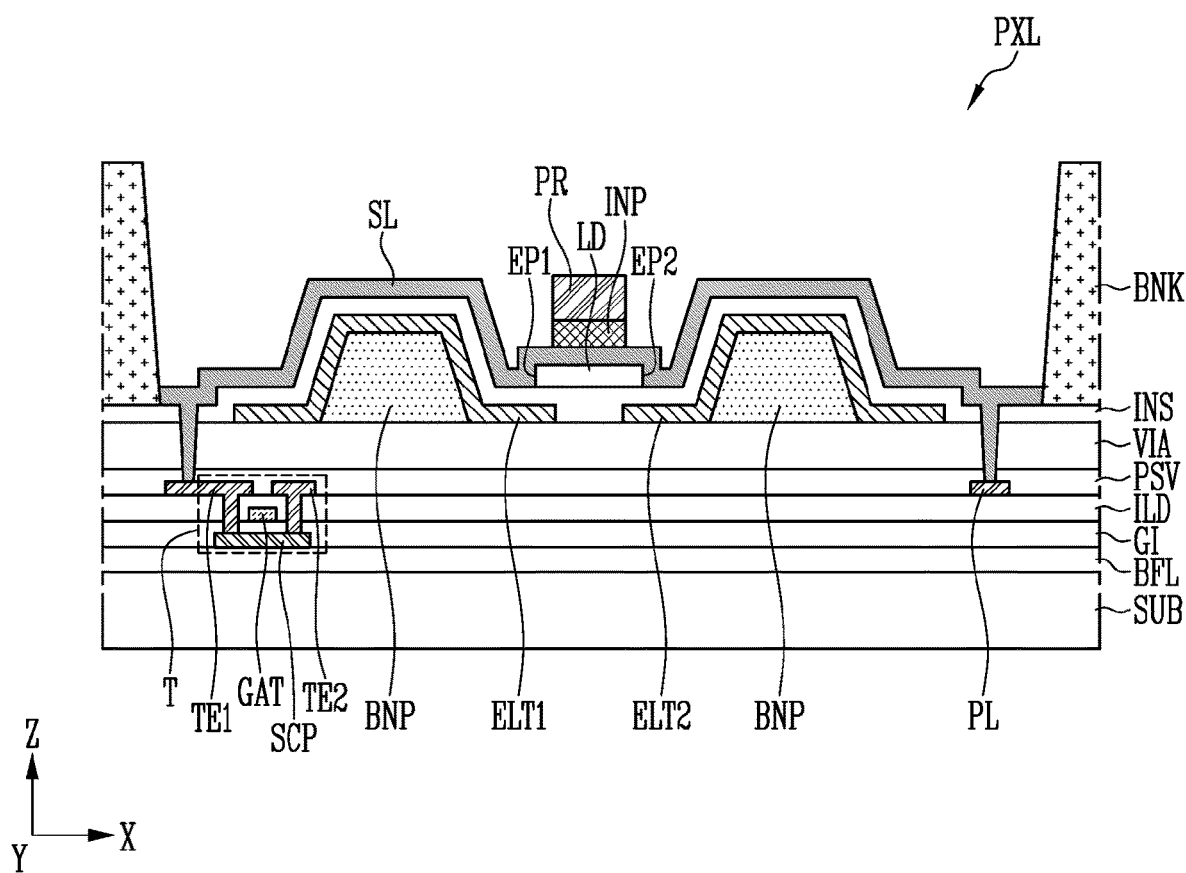

Referring to FIG. 14, subsequently, the insulating pattern INP is formed by removing the insulating pattern layer INP' exposed by the mask pattern PR. The insulating pattern INP may be formed to partially overlap the light emitting elements LD in the third direction (Z-axis direction) on the amorphous silicon layer SL. For example, the insulating pattern INP may be formed on the light emitting elements LD on the amorphous silicon layer SL, and may be formed so as not to overlap the first and second end portions EP1 and EP2 of the light emitting elements LD in the direction (Z-axis direction). For example, the insulating pattern INP may be formed to expose the first and second end portions EP1 and EP2 of the light emitting elements LD on the amorphous silicon layer SL.

Figure 15:
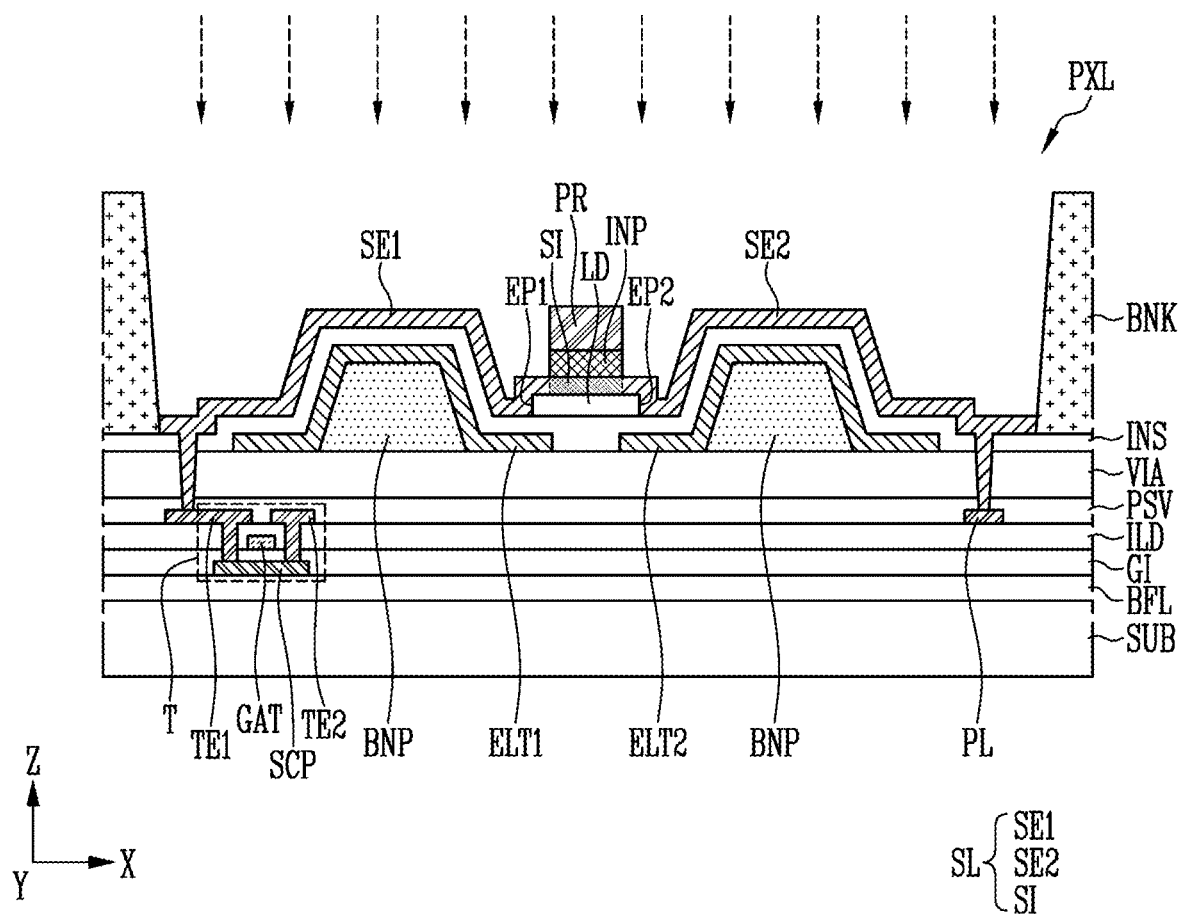

Referring to FIG. 15, the display device of FIG. 5 may be completed by partially doping the amorphous silicon layer SL.

For example, the amorphous silicon layer SL exposed by the insulating pattern INP and/or the mask pattern PR may become conductive by the dopant. For example, the first electrode portion SE1 may be formed by doping the amorphous silicon layer SL exposed by the insulating pattern INP and/or the mask pattern PR on the first end portion EP1 of the light emitting elements LD. The first electrode portion SE1 may be in contact with the first end portion EP1 of the light emitting elements LD and may function as the first electrode ET1 described with reference to FIG. 4.

The second electrode portion SE2 may be formed by doping the amorphous silicon layer SL exposed by the insulating pattern INP and/or the mask pattern PR on the second end portion EP2 of the light emitting elements LD. The second electrode portion SE2 may be in contact with the second end portion EP2 of the light emitting elements LD and may function as the second electrode ET2 described with reference to FIG. 4.

In the process of doping the amorphous silicon layer SL, an n-type dopant such as phosphorus (P), arsenic (As), or antimony (Sb) may be implanted. However, the disclosure is not necessarily limited thereto, and the n-type dopant may include any one of a group 15 element.

According to an embodiment, in the process of doping the amorphous silicon layer SL, a p-type dopant such as boron (B), aluminum (Al), gallium (Ga), or indium (In) may be implanted. However, the disclosure is not limited thereto, and the p-type dopant may include any one of a group 13 element. The doping process may be performed by various methods, however, for example, an ion implantation method may be used.

In the process of doping the amorphous silicon layer SL, the insulating portion SI may be formed between the first and second electrode portions SE1 and SE2. For example, the insulating portion SI may be masked by the insulating pattern INP and/or the mask pattern PR. Therefore, a dopant may not be implanted, and thus an insulating property may be maintained. However, the disclosure is not limited thereto, and a separate doping mask may be added according to an embodiment.

The display device of FIG. 5 may be completed by doping the amorphous silicon layer SL to form the first and second electrode portions SE1 and SE2 and the insulating portion SI, and removing the mask pattern PR.

According to the above-described embodiment, in the process of separating the light emitting elements LD from the wafer, even though the surface of the separation surface of the light emitting elements LD, for example, the surface of at least one of the first and second end portions EP1 and EP2 is not uniformly formed, the first and second electrode portions SE1 and SE2 may be in contact with the first and second end portions EP1 and EP2 of the light emitting elements LD entirely by forming the first and second electrode portions SE1 and SE2 using the amorphous silicon layer SL. For example, since the contact area with the first and second electrode portions SE1 and SE2 may be secured regardless of the shape of the separation surface of the light emitting elements LD, the emission efficiency may be improved.

Since the first and second electrode portions SE1 and SE2 may be electrically separated or disconnected by forming the insulating portion SI between the first and second electrode portions SE1 and SE2, occurrence of a short defect may be effectively prevented. Since an additional process or the like of removing the amorphous silicon layer SL between the first and second electrode portions SE1 and SE2 in order to separate the first and second electrode portions SE1 and SE2 may be omitted, the process economic feasibility may be secured.

The first and second electrode portions SE1 and SE2 and the insulating portion SI may be simultaneously formed by partially doping the amorphous silicon layer SL. Therefore, since the mask process for forming the separate electrodes connected to the end portions EP1 and EP2 of the light emitting elements LD, respectively, may be omitted, the manufacturing process may be simplified as described above.

Those skilled in the art will understand that the disclosure may be implemented in a modified form or forms without departing from the above-described embodiments. Therefore, the disclosed methods should be considered for purposes of description and not for limitation. The scope of the disclosure is included in the claims, and all equivalents will be construed as being included in the disclosure.

What is claimed is:

1. A display device comprising:
a first alignment electrode and a second alignment electrode spaced apart from each other and disposed on a substrate;
light emitting elements disposed between the first alignment electrode and the second alignment electrode; and
an amorphous silicon layer disposed on the light emitting elements, wherein the amorphous silicon layer comprises a first conductive electrode portion disposed on a first end portion of each of the light emitting elements, a second conductive electrode portion disposed on a second end portion of each of the light emitting elements, and an insulating portion between the first conductive electrode portion and the second conductive electrode portion;
wherein an upper surface of the insulating portion is coplanar with an upper surface of the first conductive electrode portion and an upper surface of the second conductive electrode portion.

2. The display device according to claim 1, wherein the first conductive electrode portion and the second conductive electrode portion include a dopant.

3. The display device according to claim 2, wherein the dopant includes at least one of boron (B), aluminum (Al), gallium (Ga), or indium (In).

4. The display device according to claim 1, further comprising: an insulating pattern disposed on the insulating portion of the amorphous silicon layer.

5. The display device according to claim 4, wherein the insulating pattern overlaps the insulating portion of the amorphous silicon layer.

6. The display device according to claim 1, wherein the first conductive electrode portion electrically contacts the first end portion of each of the light emitting elements, and the second conductive electrode portion electrically contacts the second end portion of each of the light emitting elements.

7. The display device according to claim 4, wherein the first conductive electrode portion is electrically disconnected from the first alignment electrode.

8. The display device according to claim 7, wherein the first conductive electrode portion is electrically connected to a transistor disposed on the substrate.

9. The display device according to claim 8, wherein the first conductive electrode portion is electrically connected to the transistor through a contact hole passing through a protective layer and a via layer disposed on the transistor.

10. The display device according to claim 1, wherein the first conductive electrode portion electrically connects the first alignment electrode to the first end portion of each of the light emitting elements.

11. The display device according to claim 1, further comprising: a first connection electrode disposed on the first conductive electrode portion; and a second connection electrode disposed on the second conductive electrode portion.

12. The display device according to claim 1, wherein the insulating portion of the amorphous silicon layer exposes the first end portion of each of the light emitting elements.

13. A method of manufacturing a display device, the method comprising:
preparing a substrate including a first alignment electrode and a second alignment electrode;
disposing light emitting elements between the first alignment electrode and the second alignment electrode;
forming an amorphous silicon layer on the light emitting elements;
forming an insulating layer on the amorphous silicon layer;
forming a mask pattern on the insulating layer;
forming an insulating pattern by removing the insulating layer exposed by the mask pattern; and
forming a first conductive electrode portion on a first end portion of each of the light emitting elements and a second conductive electrode portion on a second end portion of each of the light emitting elements by implanting a dopant into the amorphous silicon layer exposed by the insulating pattern,
wherein the amorphous silicon layer includes an insulating portion overlapping the mask pattern and between the first conductive electrode portion and the second conductive electrode portion, and
wherein an upper surface of the insulating portion is continuous with an upper surface of the first conductive electrode portion and an upper surface of the second conductive electrode portion.

14. The method according to claim 13, wherein the insulating portion of the amorphous silicon layer is not doped in the implanting of the dopant into the amorphous silicon layer.

15. The method according to claim 14, wherein the dopant includes at least one of boron (B), aluminum (Al), gallium (Ga), or indium (In).

* * * * *